United States Patent
Xu et al.

(10) Patent No.: US 12,289,855 B2
(45) Date of Patent: Apr. 29, 2025

(54) CHASSIS AND STORAGE DEVICE

(71) Applicant: HUAWEI TECHNOLOGIES CO., LTD., Shenzhen (CN)

(72) Inventors: Huahua Xu, Dongguan (CN); Zehong Chen, Dongguan (CN); Xinhu Gong, Shenzhen (CN); Songlin Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 350 days.

(21) Appl. No.: 17/987,103

(22) Filed: Nov. 15, 2022

(65) Prior Publication Data

US 2023/0066108 A1 Mar. 2, 2023

Related U.S. Application Data

(63) Continuation of application No. PCT/CN2021/094895, filed on May 20, 2021.

(30) Foreign Application Priority Data

May 27, 2020 (CN) .......................... 202010460909.0

(51) Int. Cl.
*H05K 7/14* (2006.01)
*G06F 1/18* (2006.01)

(52) U.S. Cl.
CPC ........... *H05K 7/1488* (2013.01); *G06F 1/186* (2013.01)

(58) Field of Classification Search
None
See application file for complete search history.

(56) References Cited

U.S. PATENT DOCUMENTS

| | | | |
|---|---|---|---|
| 9,856,912 B2* | 1/2018 | Chen | A47B 88/57 |
| 10,126,788 B2 | 11/2018 | Dai | |
| 2008/0135714 A1* | 6/2008 | Huang | A47B 88/493 |
| | | | 248/429 |
| 2009/0001864 A1* | 1/2009 | Huang | A47B 88/49 |
| | | | 312/333 |

(Continued)

FOREIGN PATENT DOCUMENTS

| | | |
|---|---|---|
| CN | 104375596 A | 2/2015 |
| CN | 104640407 A | 5/2015 |
| CN | 206115362 U | 4/2017 |

(Continued)

*Primary Examiner* — James Wu
*Assistant Examiner* — Christopher L Augustin

(57) ABSTRACT

A chassis for a storage device includes a chassis body and an installation frame slidably installed in the chassis body by using a sliding assembly. The installation frame is configured to slide out from two ends of the chassis body. The sliding assembly includes a first sliding rail, a second sliding rail, and a first limiting assembly. The first sliding rail is fastened to the chassis body, the second sliding rail is fastened to the installation frame, and the first sliding rail and the second sliding rail are slidably assembled. The first limiting assembly includes a first clamping part and a second clamping part that fit with each other. A first drive component drives the first clamping part to be clamped with the second clamping part, and a second drive component drives the first clamping part to be detached from the second clamping part.

19 Claims, 13 Drawing Sheets

(56) References Cited

U.S. PATENT DOCUMENTS

2015/0123528 A1* 5/2015 Wu ..................... A47B 88/443
312/319.1

FOREIGN PATENT DOCUMENTS

| CN | 206975580 U | 2/2018 |
| CN | 109002096 A | 12/2018 |
| CN | 110708914 A | 1/2020 |
| CN | 210155586 U | 3/2020 |

* cited by examiner

CHASSIS AND STORAGE DEVICE

CROSS-REFERENCE TO RELATED APPLICATIONS

This application is a continuation of International Application PCT/CN2021/094895, filed on May 20, 2021, which claims priority to Chinese Patent Application Chinese Patent Application No. 202010460909.0, filed on May 27, 2020. The disclosures of the aforementioned priority applications are hereby incorporated by reference in their entirety.

TECHNICAL FIELD

This application relates to the field of storage device technologies, and in particular, to a chassis and a storage device.

BACKGROUND

As a data amount grows, a user has a higher requirement for a storage capability of a storage device. In the storage device, a storage capacity is a key factor that affects the storage capability of the storage device. Simply speaking, a chassis of a conventional storage device includes a chassis body and hard disks installed in the chassis body. A capacity of a single hard disk and a quantity of hard disks determine the storage capacity of the storage device. With an increase in the quantity of hard disks, the industry also has a higher requirement for how to improve a design of the chassis.

SUMMARY

This application provides a chassis and a storage device that are properly arranged. In addition, sliding rails that are slidably assembled are used to implement sliding of an installation frame from two ends of a chassis body, and a limiting assembly is used to keep the installation frame fastened to the chassis body at a specified position.

According to an aspect, this application provides a chassis. The chassis includes a chassis body and an installation frame installed in the chassis body, the chassis may have a channel that passes through a first end and a second end of the chassis body, and the installation frame is installed in the channel of the chassis body by using a sliding assembly. The installation frame may be configured to install a hard disk, an electronic component, and the like. The installation frame can slide out from the two ends of the chassis body, to facilitate operations such as installation, maintenance, and removal of a structure installed in the installation frame. Specifically, a first part of the installation frame can slide out from the first end of the chassis body, and a second part of the installation frame can slide out from the second end of the chassis body. The sliding assembly includes a first sliding rail, a second sliding rail, and a first limiting assembly, the first sliding rail is fastened to the chassis body, the second sliding rail is fastened to the installation frame, and the first sliding rail and the second sliding rail are slidably assembled, so that the installation frame can slide in the chassis body. The first limiting assembly includes a first clamping part and a second clamping part that fit with each other, a first drive component that drives the first clamping part to be clamped with the second clamping part, and a second drive component that drives the first clamping part to be detached from the second clamping part. The first clamping part may be disposed on the first sliding rail, and the second clamping part may be disposed on the second sliding rail. Therefore, when the first clamping part is clamped with the second clamping part, the installation frame is kept fastened relative to the chassis body, to facilitation an operation such as installation, removal, or maintenance of a related component in the installation frame. When the installation frame is located in the chassis body, the first drive component can drive the first clamping part to be clamped with the second clamping part, to fasten the installation frame to the chassis body in a first direction. When the first clamping part is clamped with the second clamping part, and the installation frame needs to be slid out, the second drive component can drive the first clamping part to be detached from the second clamping part, to enable the installation frame to slide out of the chassis body. The first direction is a sliding direction of the sliding assembly.

In the technical solution of this application, the installation frame can slide out from the two ends of the chassis body, so that a maximum pull-out length of the installation frame is relatively small. Therefore, after the installation frame is pulled out, a relatively large torque is not generated for the sliding rail assembly between the installation frame and the chassis body. This helps reduce manufacturing or purchase costs of the sliding rail assembly. In this way, more electronic components can be installed in the installation frame. In addition, in an actual application, because a maximum pull-out length of the installation frame is effectively shortened, when a plurality of chassis bodies are placed in an application site, for example, an equipment room, in a centralized manner, a distance between chassis bodies that are placed oppositely can be effectively shortened. This helps increase space utilization of the application site, for example, the equipment room, and improve operation space of an operator. When the installation frame is located in the chassis body, the first limiting assembly may be used to enable the installation frame to be fastened in the chassis body without sliding out of the chassis body. This can improve structural stability of the chassis.

A structure of the first limiting assembly may include a fastening member fastened to the first sliding rail and a rotating member connected to the second sliding rail by using a rotating shaft, where the rotating member includes a limiting part and a drive part, and the limiting part fits with the fastening member through clamping; and further include a reset member connected to the rotating member, where the reset member is configured to drive the rotating member to rotate in a direction in which the limiting part faces the fastening member, or the reset member enables the rotating member to have a tendency to rotate in a direction in which the limiting part faces the fastening member. The first limiting assembly further includes a pull lever slidably assembled in the second sliding rail, there is a stepped inclined surface on a side that is of the pull lever and that faces the rotating member, the drive part of the rotating member abuts against the stepped inclined surface, and when the pull lever slides in the first direction, the stepped inclined surface drives the rotating member to rotate in which the limiting part gets away from the fastening member. Therefore, the fastening member is the first clamping part, the rotating member is the second clamping part, the reset member is the first drive component, and the pull lever is the second drive component.

Another structure of the first limiting assembly may include a fastening member fastened to the second sliding rail and a rotating member connected to the first sliding rail by using a rotating shaft, where the rotating member includes a limiting part and a drive part, and the limiting part fits with the fastening member through clamping; and further include a reset member connected to the rotating member, where the reset member is configured to drive the rotating member to rotate in a direction in which the limiting part faces the fastening member, or the reset member enables the rotating member to have a tendency to rotate in a direction in which the limiting part faces the fastening member. The first limiting assembly further includes a pull lever slidably assembled in the first sliding rail, there is a stepped inclined surface on a side that is of the pull lever and that faces the rotating member, the drive part of the rotating member abuts against the stepped inclined surface, and when the pull lever slides in the first direction, the stepped inclined surface drives the rotating member to rotate in which the limiting part gets away from the fastening member. Therefore, the fastening member is the second clamping part, the rotating member is the first clamping part, the reset member is the first drive component, and the pull lever is the second drive component.

In the foregoing two structures of the first limiting assembly, the fastening member may be a protrusion, and the limiting part may be a clamping slot; or the fastening member may be a clamping slot, and the limiting part may be a protrusion. Provided that the fastening member can be clamped with the limiting part, and specific structures of the fastening member and the limiting part may not be limited.

A structure of the first limiting assembly may include a clamping post disposed on the first sliding rail and a sliding slot disposed on the second sliding rail, where the clamping post fits with the sliding slot; and further include a poke lever disposed on the second sliding rail and a reset component connected to the clamping post, where the reset component can drive the clamping post toward the bottom of the sliding slot. When the clamping post is located in the sliding slot, the poke lever can lap the clamping post, to drive the clamping post to move in a direction in which the clamping post is detached from the sliding slot. The second sliding rail further has a sliding track that extends in the first direction, and the clamping post can slide in the sliding track after being detached from the sliding slot. In this solution, when the clamping post is driven by the reset component to be located at the bottom of the sliding slot, the installation frame can be fastened to the chassis body in the first direction. When the installation frame needs to be slid out of the chassis body, the poke lever may be used to poke the clamping post out of the sliding slot to the sliding track, to enable the installation frame to slide in the chassis body. The clamping post is the first clamping part, the sliding slot is the second clamping part, the reset component is the first drive component, and the poke lever is the second drive component.

Another structure of the first limiting assembly may include a clamping post disposed on the second sliding rail and a sliding slot disposed on the first sliding rail, where the clamping post fits with the sliding slot; and further include a poke lever disposed on the first sliding rail and a reset component connected to the clamping post, where the reset component can drive the clamping post toward the bottom of the sliding slot. When the clamping post is located in the sliding slot, the poke lever can lap the clamping post, to drive the clamping post to move in a direction in which the clamping post is detached from the sliding slot. The first sliding rail further has a sliding track that extends in the first direction, and the clamping post can slide in the sliding track after being detached from the sliding slot. In this solution, when the clamping post is driven by the reset component to be located at the bottom of the sliding slot, the installation frame can be fastened to the chassis body in the first direction. When the installation frame needs to be slid out of the chassis body, the poke lever may be used to poke the clamping post out of the sliding slot to the sliding track, to enable the installation frame to slide in the chassis body. The clamping post is the second clamping part, the sliding slot is the first clamping part, the reset component is the first drive component, and the poke lever is the second drive component.

When the poke lever is specifically disposed, the poke lever may be an elastic poke lever or connected to an elastic reset structure. After the poke lever enables the clamping post to slide out of the sliding slot, the poke lever may be reset to an initial position. The initial position is a position at which the poke lever laps the clamping post when the clamping post is located in the sliding slot.

The clamping post and the reset component may be in an integral structure, that is, the clamping post has elasticity, and is, for example, a spring plate. Alternatively, the reset component is an independent structure such as a telescopic spring, and is connected to the clamping post.

To also keep the installation frame fastened to the chassis body after the installation frame slides out of the chassis body, the chassis in this application further includes two second limiting assemblies, respectively configured to fasten the installation frame to the chassis body after the first part and the second part of the installation frame slide out of the chassis body. Specifically, a structure of the second limiting assembly includes a third clamping part, a fourth clamping part, a third drive component that drives the third clamping part to be clamped with the fourth clamping part, and a fourth drive component that drives the third clamping part to be detached from the fourth clamping part. The third clamping part is located on the first sliding rail, and the fourth clamping part is located on the second sliding rail. When one end of the installation frame slides out of the chassis body by a specified distance, a third drive component corresponding to the end drives a third clamping part to be clamped with a fourth clamping part, to fasten the installation frame to the chassis body in the first direction, to facilitate installation, disassembly, and maintenance of a structure in the installation frame; and when the installation frame needs to be slid into the chassis body, a fourth drive component drives the third clamping part to be detached from the fourth clamping part, to enable the installation frame to slide into the chassis body.

A structure of the second limiting assembly may include the third clamping part fastened to the first sliding rail and a wrench connected to the second sliding rail by using a rotating axis. The wrench includes the fourth clamping part, a reset structure, and an operation part. When the installation frame slides out of the chassis body by a specified distance, the reset structure can drive the wrench to rotate in a direction in which the fourth clamping part faces the third clamping part, to clamp the third clamping part with the fourth clamping part, to fasten the installation frame to the chassis body. When the installation frame needs to be slid into the chassis body, the operation part can drive the wrench to rotate in a direction in which the fourth clamping part gets away from the third clamping part, to detach the third clamping part from the fourth clamping part. The reset structure is the third drive component, and the operation part is the fourth drive component.

Another structure of the second limiting assembly may include the third clamping part fastened to the first sliding rail and a spring plate installed on the second sliding rail. The spring plate includes the fourth clamping part and an operation part. The spring plate has elasticity. Therefore, the spring plate can drive the spring plate to swing in a direction in which the fourth clamping part faces the third clamping part. The operation part can drive the spring plate to swing in a direction in which the fourth clamping part gets away from the third clamping part. The spring plate is the third drive component and the operation part is the fourth drive component.

In the foregoing embodiment, the third clamping part of the second limitation component may be a limiting protrusion, and the fourth clamping part of the second limitation component is a limiting slot; or the third clamping part of the second limiting assembly may be a limiting slot, and the fourth clamping part of the second limiting assembly may be a limiting protrusion. Specific structures of the third clamping part and the fourth clamping part are not limited, provided that clamping can be implemented.

According to a second aspect, this application further provides a storage device. The storage device includes the chassis in any one of the foregoing technical solutions, so that the installation frame can be slid out from two sides of the chassis, to facilitate installation, disassembly, and maintenance of a structure in the installation frame. In addition, the installation frame can be reliably connected to the chassis by using a limiting assembly, so that the storage device has relatively good stability.

LIST OF REFERENCE NUMERALS

100: storage device; 200: channel;
1: cabinet; 2: chassis;
21: chassis body; 211: first end;
212: second end; 22: installation frame;
221: first accommodation space; 222: second accommodation space;
223: fan compartment; 23: sliding assembly;
231: first sliding rail; 232: second sliding rail;
24: first limiting assembly; 241: fastening member;
242: rotating member; 2421: limiting part
2422: drive part; 2423: rotating shaft
243: pull lever; 2431: stepped inclined surface;
244: reset member; 245: clamping post;
246: poke lever; 247: sliding slot;
248: sliding track; 25: second limiting assembly;
251-limiting protrusion; 252: wrench;
2521: rotating shaft: 2522: limiting slot;
2523: reset structure; 2524: operation part;
253: spring plate; 2531: limiting port;
2532: pressing part.

DESCRIPTION OF EMBODIMENTS

To make the objectives, technical solutions, and advantages of this application clearer, the following further describes this application in detail with reference to the accompanying drawings.

To facilitate understanding of a chassis provided in embodiments of this application, the following first describes an application scenario of the chassis.

The chassis provided in the embodiments of this application may be used in a plurality of types of storage devices, and is configured to accommodate, support, or fasten electrical components in the storage devices. Specifically, a chassis may include hard disks (which may be storage components such as a hard disk drive or a solid-state drive), a circuit board assembly, and a heat dissipation fan. The hard disks, the circuit board assembly, and the heat dissipation fan may be installed in the chassis, and the chassis may protect and support the hard disks, the circuit board assembly, and the heat dissipation fan, to improve security of the storage device. In addition, the hard disks, the circuit board assembly, and the heat dissipation fan may be assembled into the chassis to improve integration of the storage device and form modules, to facilitate installation, arrangement, and other operations on a construction site. In a specific implementation, the hard disk is configured to store data to implement a storage function of the storage device. The circuit board assembly is electrically connected to the hard disks to implement functions such as power supply, data distribution, and data reading for the hard disks. The heat dissipation fan can generate cooling airflow to dissipate heat for the hard disks and the circuit board assembly, so as to ensure normal running of the storage device.

Figure 1:
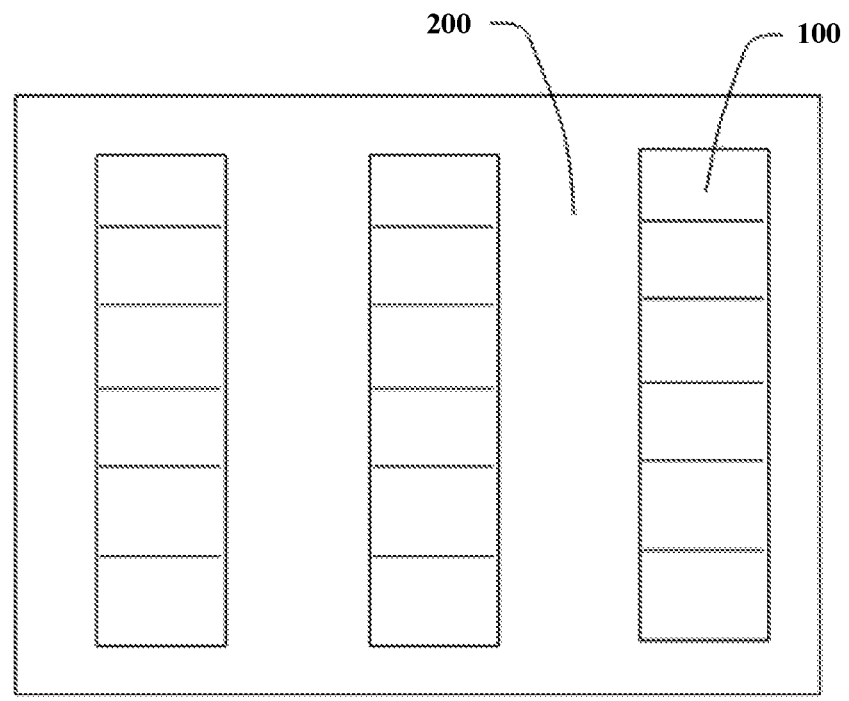
FIG. 1 is a layout diagram of storage devices in an equipment room.

In some implementations of the conventional technology, the chassis may include a chassis body and an installation frame located in the chassis body. The installation frame is fixedly disposed in the chassis body, and the chassis body is installed in the storage device in a pulling manner. The hard disks, the circuit board assembly, and the heat dissipation fan may be disposed in the installation frame. When the hard disk assembly needs to be maintained, the entire chassis needs to be pulled out from one side of the storage device and be opened for an operation. In a conventional storage device, hard disks may be disposed at a front end (or a pulling end) of a chassis, a circuit board assembly may be disposed at a rear end (an end far away from the pulling end) of the chassis, and a heat dissipation fan may be disposed between the hard disks and the circuit board assembly. Under action of the heat dissipation fan, cooling airflow may enter from a front end of the installation frame and be discharged from a rear end of the installation frame. In actual use, after the chassis body is pulled out from the storage device, a cantilever structure is formed between the chassis body and the storage device. Therefore, if a pull-out length of the installation frame is very long or there are a large quantity of hard disks in the installation frame, there is a high risk of toppling when the installation frame is very heavy. In addition, after the chassis body is pulled out, a pulling structure (for example, a holding rail) between the chassis body and the storage device bears a large torque, and risks such as bending and deformation are likely to occur. In addition, if a pulling structure with higher stress strength is used, purchase (or manufacturing) costs significantly increase, and market competitiveness of the chassis is reduced. FIG. 1 is a layout diagram of storage devices in an equipment room. Referring to FIG. 1, in an actual application, storage devices 100 are arranged in columns in the equipment room, and a channel 200 may be formed between two columns of storage devices 100, to facilitate worker walking. However, during maintenance, after a chassis body is entirely pulled out from the storage device 100, a pull-out length of the chassis body needs to be not greater than a width of the channel 200. Therefore, a minimum width of the channel 200 usually depends on a maximum pull-out length of an installation frame 22. This is not conducive to implementing minimum configuration of the channel 200 and increasing space utilization of the equipment room. When the channel 200 is relatively narrow, space is small. This is not conducive to maintaining the chassis body by an operator.

Based on the foregoing problems existing in the conventional storage device, the embodiments of this application provide a chassis and a storage device that can reduce a pull-out length of an installation frame 22.

To clearly understand the technical solutions of this application, the following describes in detail the chassis provided in this application with reference to specific embodiments and the accompanying drawings.

Terms used in the following embodiments are merely intended to describe specific embodiments, but are not intended to limit this application. Terms "one", "a", "the", "the foregoing", "this", and "the one" of singular forms used in this specification and the appended claims of this application are also intended to include plural forms like "one or more", unless otherwise specified in the context clearly. It should be further understood that, in the following embodiments of this application, "at least one" or "one or more" means one, two, or more.

Reference to "an embodiment", "some embodiments", or the like described in this specification indicates that one or more embodiments of this application include a specific feature, structure, or characteristic described with reference to the embodiments. Therefore, in this specification, statements, such as "in an embodiment", "in some embodiments", "in some other embodiments", and "in other embodiments", that appear at different places do not necessarily mean referring to a same embodiment, instead, they mean "one or more but not all of the embodiments", unless otherwise specifically emphasized in other ways. The terms "include", "include", "have", and variants of the terms all mean "include but are not limited to", unless otherwise specifically emphasized in other ways.

Figure 2:
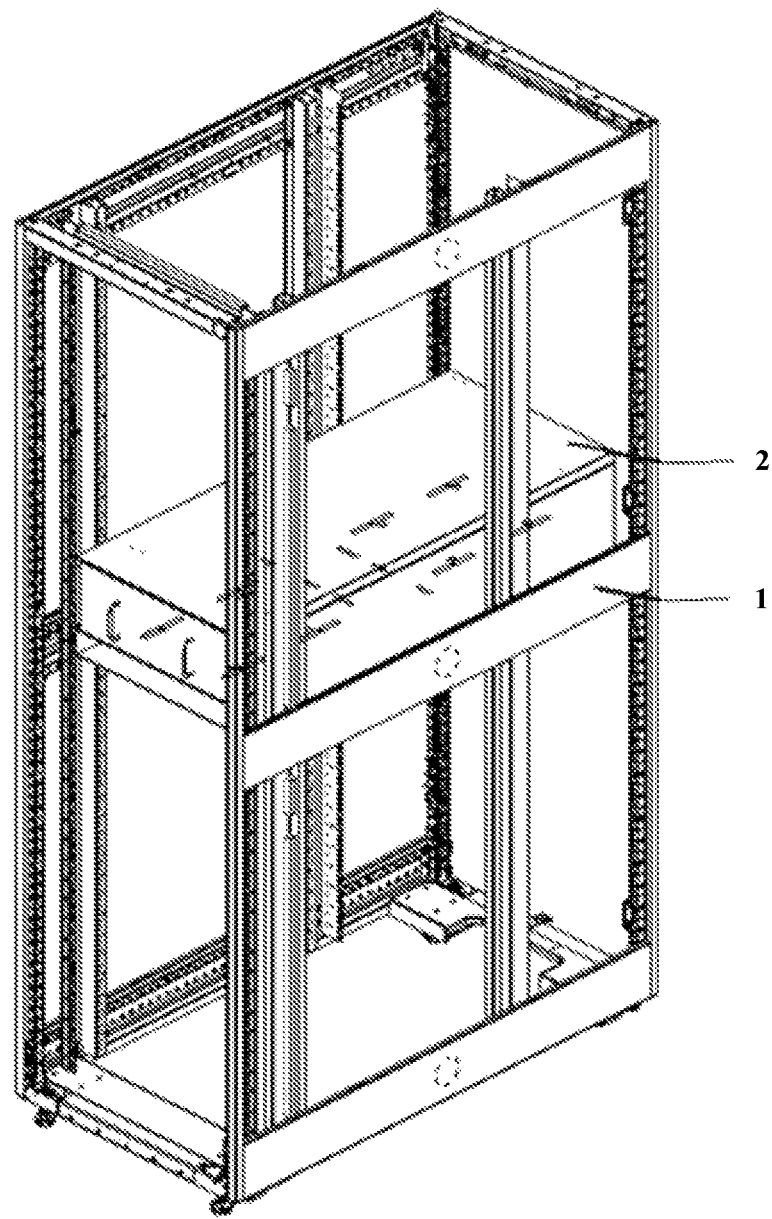
FIG. 2 is a schematic diagram of a structure of a storage device according to an embodiment of this application.

FIG. 2 is a schematic diagram of a structure of a storage device 100 according to an embodiment of this application. As shown in FIG. 2, in an embodiment provided in this application, the storage device 100 includes a cabinet 1 and a chassis 2 installed in the cabinet 1, and electronic components are installed in the chassis 2 to implement a function of the storage device 100. In addition, if the chassis 2 is installed in the cabinet 1, the cabinet 1 may provide protection for the chassis 2 and the storage device 100 in the chassis 2. In another implementation, the storage device 100 may not include the cabinet 1. This is not limited in the present invention.

Figure 3:
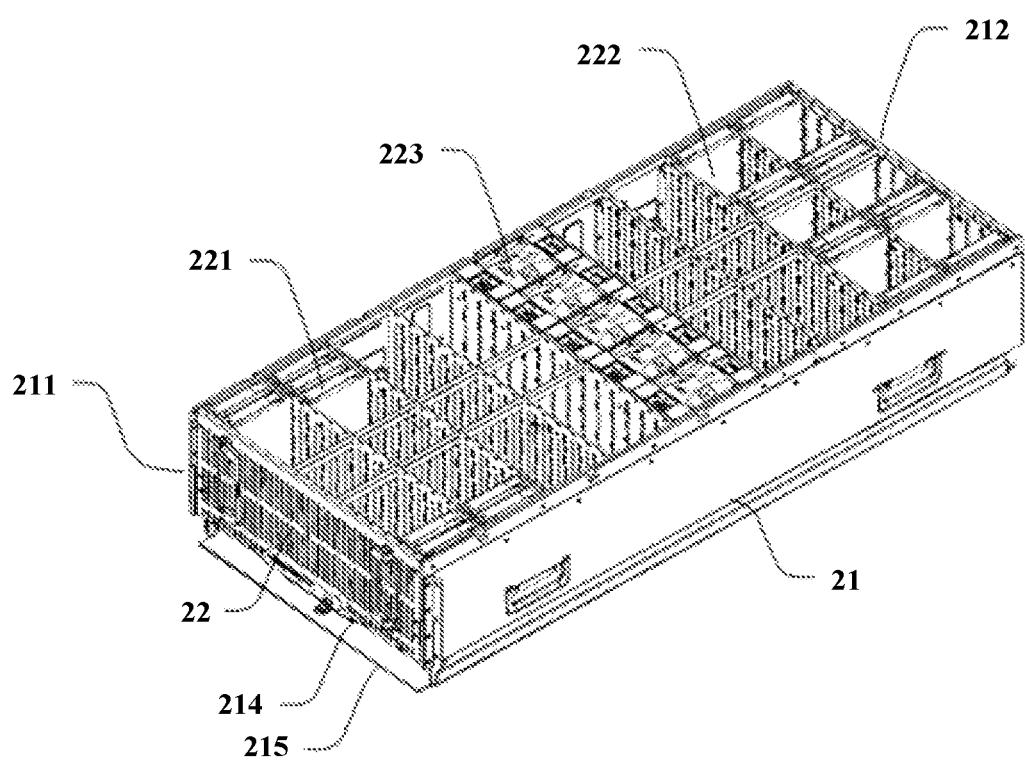
FIG. 3 is a schematic diagram of a partial structure of a chassis of a storage device according to an embodiment of this application.
Figure 4:
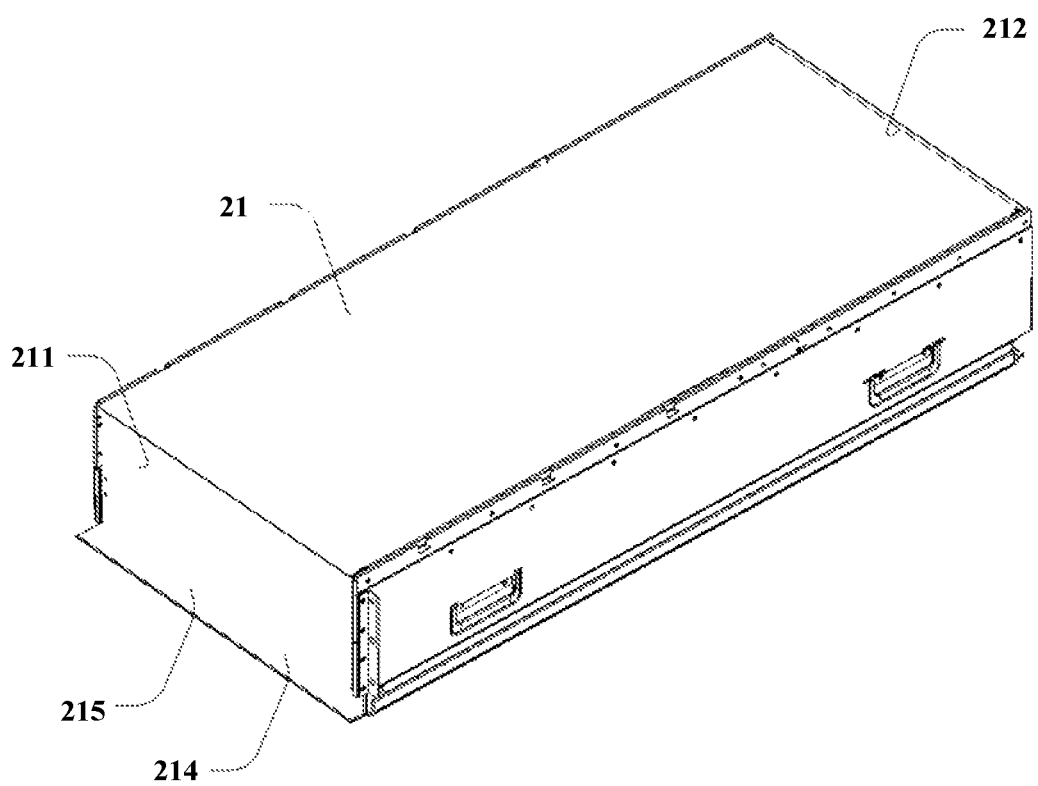
FIG. 4 is a schematic diagram of a structure of a chassis body according to an embodiment of this application.
Figure 5:
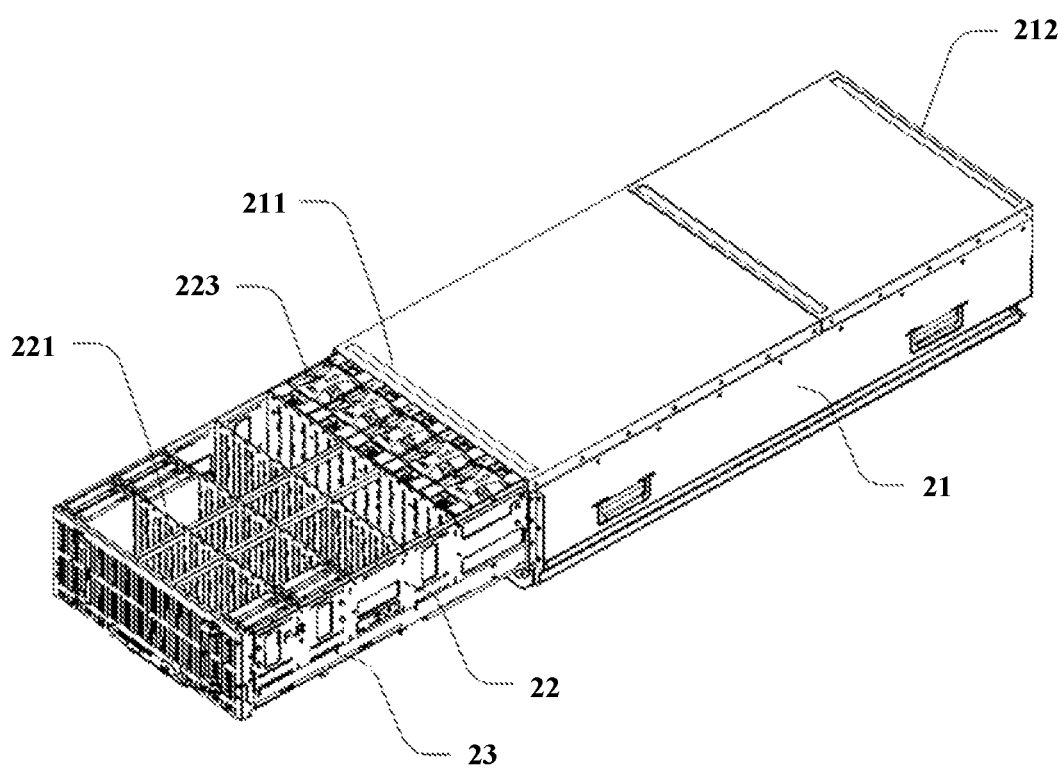
FIG. 5 is a schematic diagram of a status of a chassis according to an embodiment of this application.
Figure 6:
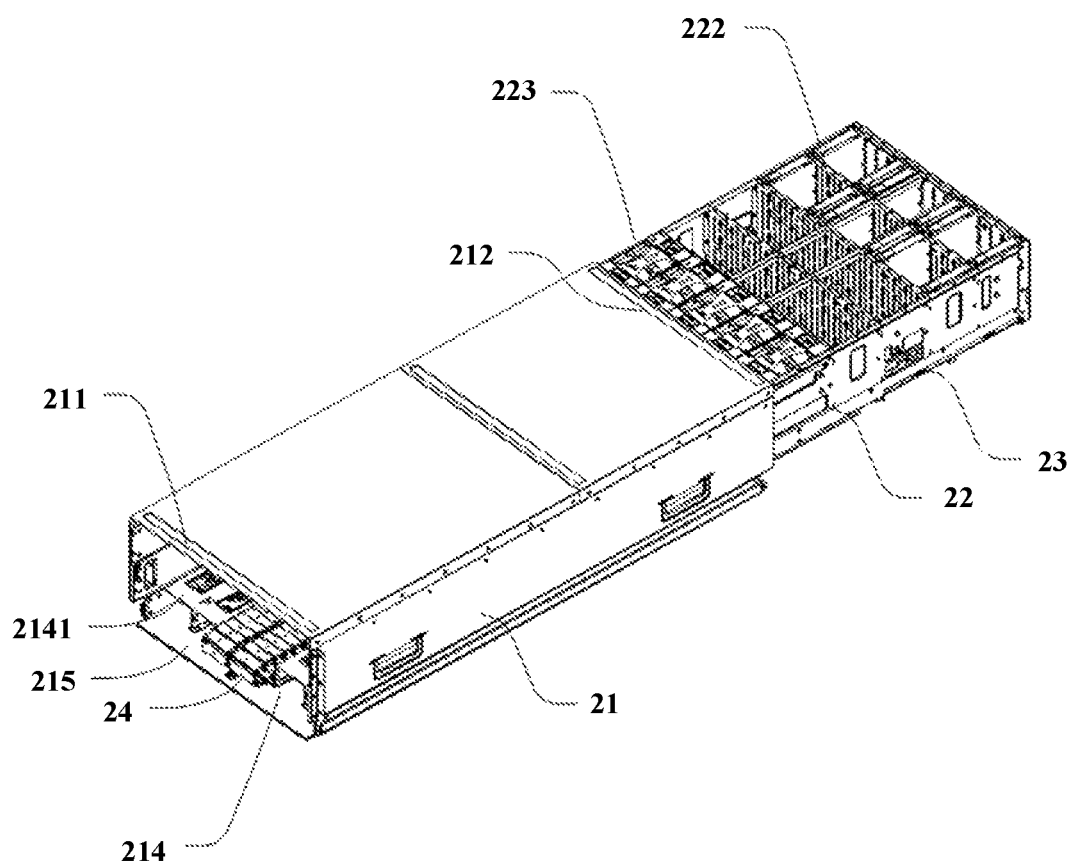
FIG. 6 is a schematic diagram of another status of a chassis according to an embodiment of this application.

FIG. 3 is a schematic diagram of a partial structure of a chassis according to an embodiment of this application. As shown in FIG. 3, the chassis 2 includes a chassis body 21 and an installation frame 22 located in the chassis body 21. To describe a structure of the installation frame 22 in the chassis 2, a top cover plate is omitted in the chassis body 21 of the chassis 2 in FIG. 3. It can be seen that the installation frame 22 includes first accommodation space 221 and second accommodation space 222. The first accommodation space 221 and the second accommodation space 222 may be used to accommodate hard disks or other electronic components. The installation frame 22 may be disposed in the chassis body 21 in a bi-directional pulling manner. FIG. 4 is a schematic diagram of a structure of a chassis body according to an embodiment of this application. In a specific embodiment, the chassis body 21 has a channel that passes through a first end 211 and a second end 212 of the chassis body 21, and the installation frame 22 is slidably installed in the channel. FIG. 5 is a schematic diagram of a status of a chassis according to an embodiment of this application. FIG. 6 is a schematic diagram of another status of a chassis according to an embodiment of this application. As shown in FIG. 5 and FIG. 6, a first part that is of an installation frame 22 and that is close to a first end 211 can slide out from the first end 211 of a chassis body 21, as shown in FIG. 5. A second part that is of the installation frame 22 and that is close to a second end 212 can slide out from the second end 212 of the chassis body 21, as shown in FIG. 6. An example in which the chassis 2 is in a used state is used. It is considered that a front end of the chassis body 21 is the first end 211, and a rear end of the chassis body 21 is the second end 212. In this case, the installation frame 22 may pull out the first part from the front end of the chassis body 21, and may pull out the second part from the rear end of the chassis body 21. Therefore, components such as hard disks that are in the first part and the second part of the installation frame 22 may be respectively maintained. A pull-out length of the installation frame 22 can be effectively reduced by using the foregoing arrangement manner. Specifically, if a length of the first part is L1 and a length of the second part is L2, a total length of the installation frame is L3, where both L1 and L2 are less than L3. If the chassis 2 uses the foregoing bi-directional pulling manner, a maximum pull-out length of the installation frame 22 may be not greater than any one of L1 and L2, and is less than L3. Therefore, after the installation frame 22 is pulled out, a relatively large torque is not generated for a pulling structure between the installation frame 22 and the chassis body 21. This helps reduce manufacturing or purchase costs of the pulling structure and improve market competitiveness of the chassis body 21. In this way, more electronic components can be installed in the installation frame. In addition, in an actual application, because the maximum pull-out length of the installation frame 22 is effectively shortened, when a plurality of chassis bodies 21 are placed in an application site, for example, an equipment room, in a centralized manner, a distance between two chassis bodies 21 that are placed oppositely (for example, front ends or rear ends of the two chassis bodies 21 are placed oppositely) can be effectively shortened. In this way, space utilization of the application site, for example, the equipment room, is increased, and an operation space of an operator is improved. The electronic component in this embodiment of the present invention may be hardware, a computing blade, or the like. This is not limited in this embodiment of the present invention.

It should be noted that the foregoing length is a length in a direction from the first end 211 of the chassis 2 to the second end 212, namely, a length in a stretching direction of the installation frame 22. Orientation words such as "front", "rear", "left", "right", and "bottom" that appear in the embodiments of this application are merely used to describe a relative relationship between directions by using an example in which the chassis 2 and the storage device each are in one used state.

Figure 7:
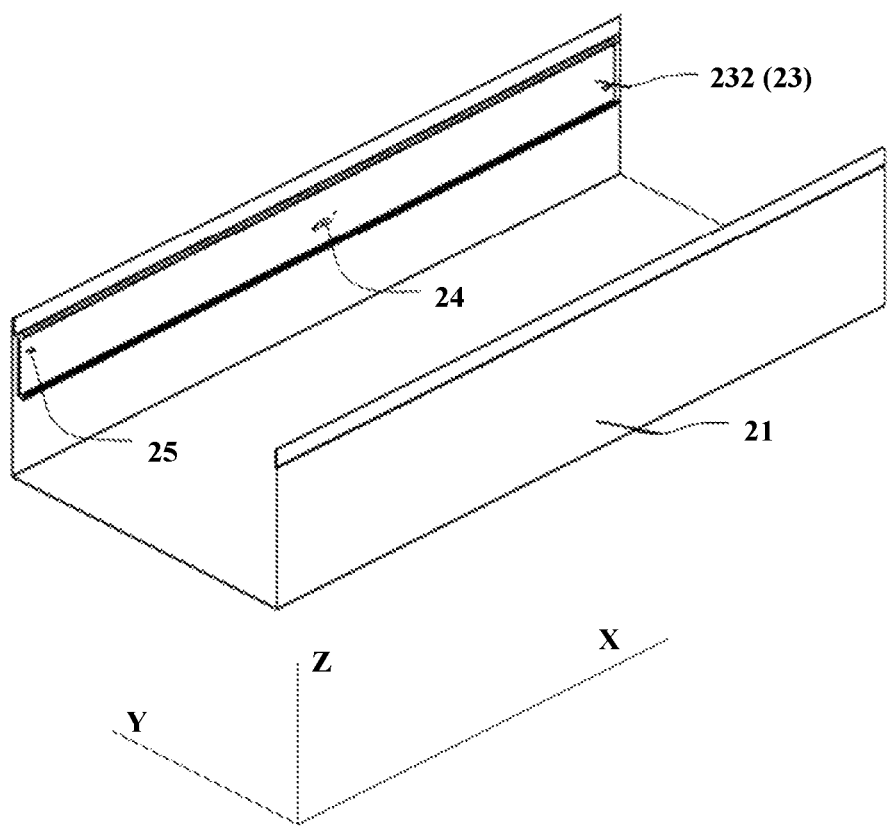
FIG. 7 is a schematic diagram of a structure of a chassis body according to an embodiment of this application.
Figure 8:
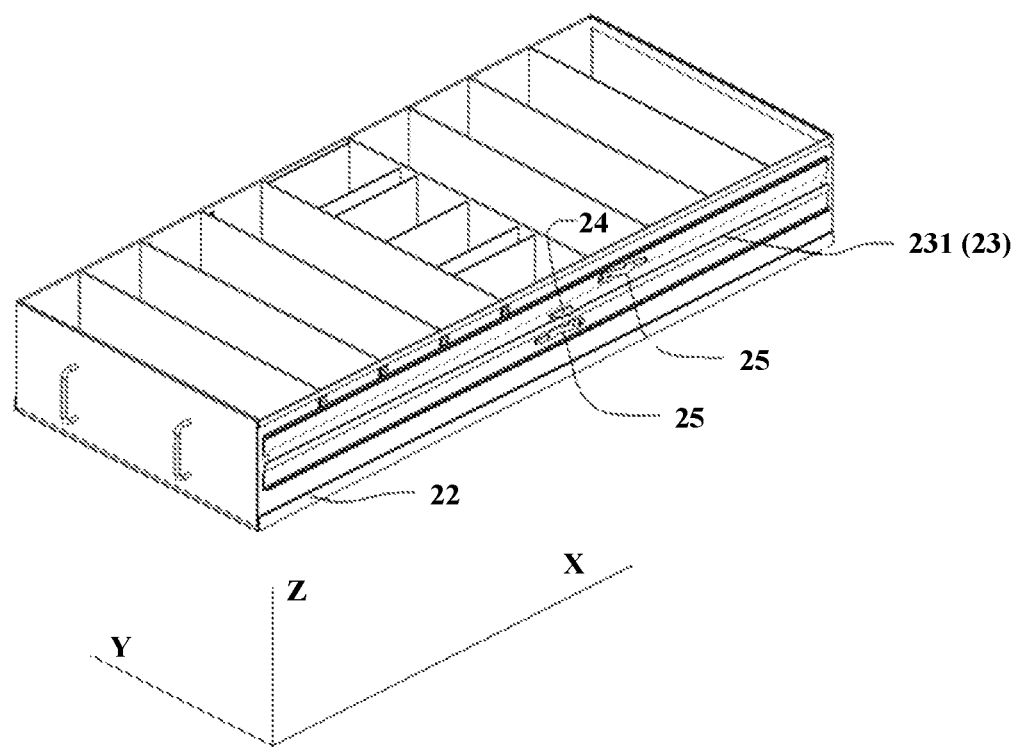
FIG. 8 is a schematic diagram of a structure of an installation frame according to an embodiment of this application.

Refer to FIG. 3, FIG. 7, and FIG. 8. FIG. 7 is a schematic diagram of a structure of a chassis body according to an embodiment of this application. FIG. 8 is a schematic diagram of a structure of an installation frame according to an embodiment of this application. To enable parts of the installation frame 22 to slide out from the first end 211 and the second end 212 of the chassis body 21, a sliding assembly 23 may be disposed between the chassis body 21 and the installation frame 22. The sliding assembly 23 may include a first sliding rail 231 and a second sliding rail 232 that are slidably assembled, the first sliding rail 231 is fastened to the chassis body 21, and the second sliding rail 232 is fastened to the installation frame 22, to implement slidable installation between the installation frame 22 and the chassis body 21. To enable the installation frame 22 to be reliably fastened to the chassis body 21 without accidentally sliding out when the installation frame 22 does not slide out of the chassis body 21, the sliding assembly 23 further includes a first limiting assembly 24. The first limiting assembly 24 includes a first clamping part and a second clamping part that fit with each other, that is, the first clamping part can be clamped with the second clamping part. The first limiting assembly 24 further includes a first drive component that drives the first clamping part to be clamped with the second clamping part, and a second drive component that drives the first clamping part to be detached from the second clamping part. In this solution, the first clamping part is located on the first sliding rail 231, and the second clamping part is located on the second sliding rail 232. When the installation frame 22 is located in the chassis body 21, does not slide out of the chassis body 21, and is completely located in the chassis body 21, the first drive component can drive the first clamping part to be clamped with the second clamping part, to limit, in a first direction X, the first sliding rail 231 and the second sliding rail 232 to be fastened relative to each other, that is, to enable the installation frame 22 to be reliably located in the chassis body 21 without easily sliding out of the chassis body 21, thereby improving reliability of the chassis. When the installation frame 22 needs to be slid out of the chassis, the second drive component is used to drive the first clamping part to be detached from the second clamping part, to enable the installation frame 22 to slide out of the chassis body 21.

It should be noted that, in this embodiment of this application, the first direction X is a sliding direction of the sliding assembly 23, a second direction Y is a direction parallel to a direction in which the first sliding rail 231 faces the second sliding rail 232, and a third direction Z is perpendicular to both the first direction X and the second direction Y.

Figure 9:
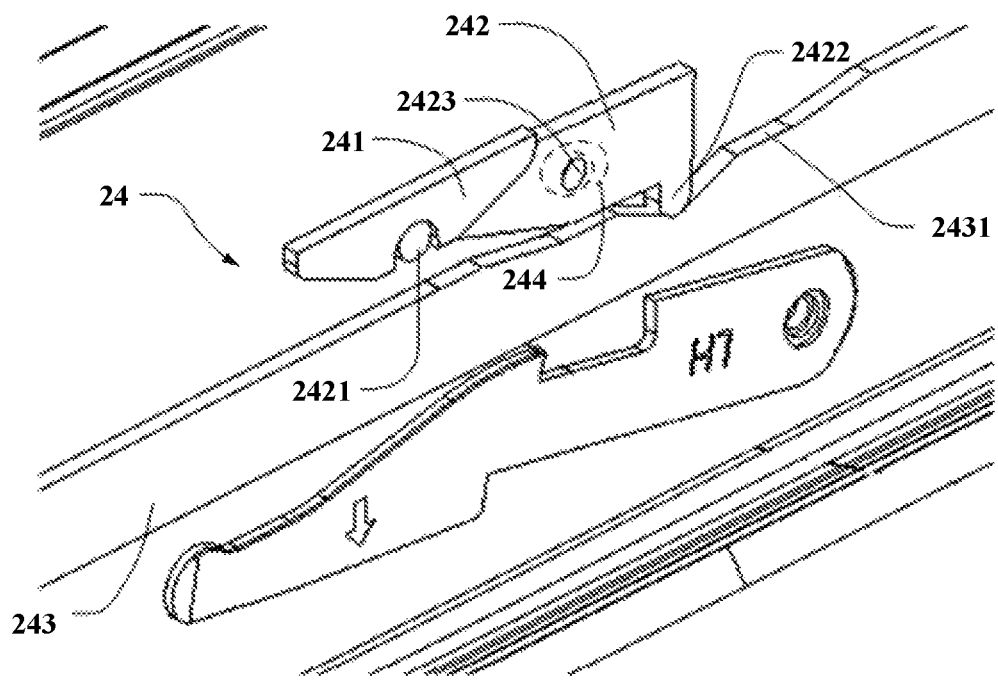
FIG. 9 is a schematic diagram of a status of a first limiting assembly when an installation frame is fastened to a chassis body according to an embodiment of this application.
Figure 10:
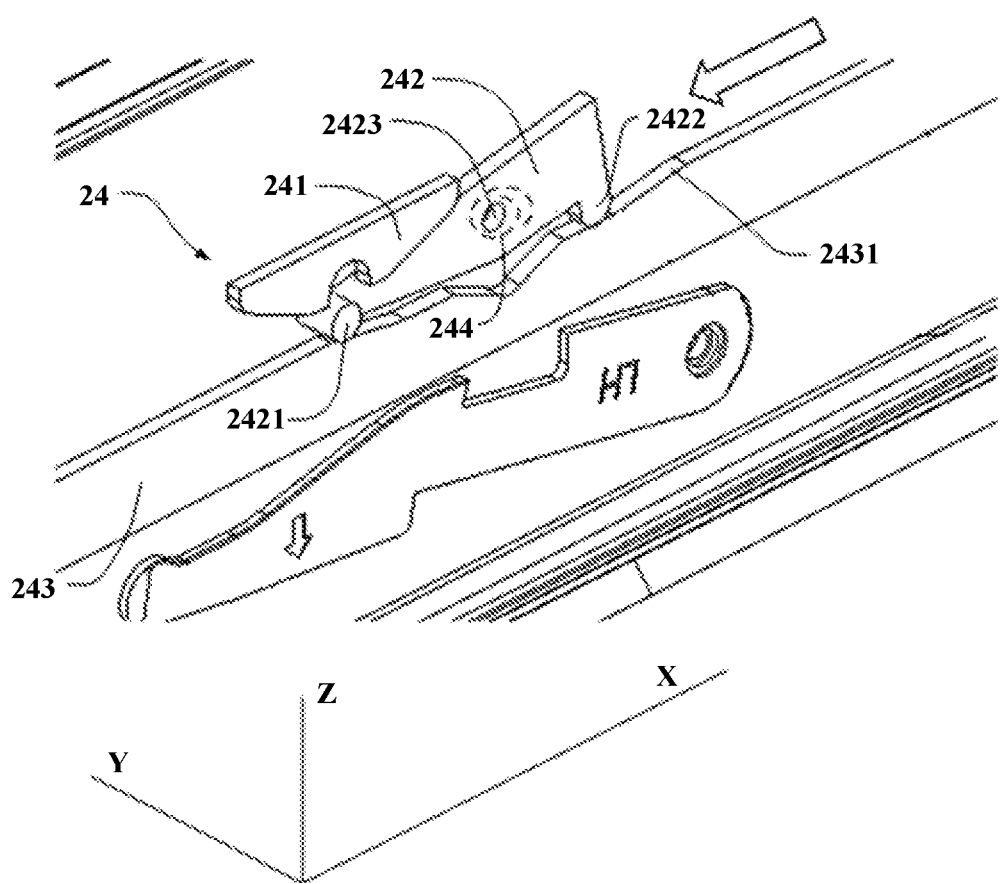
FIG. 10 is a schematic diagram of a status of a first limiting assembly when an installation frame slides out from a first end of a chassis body according to an embodiment of this application.
Figure 11:
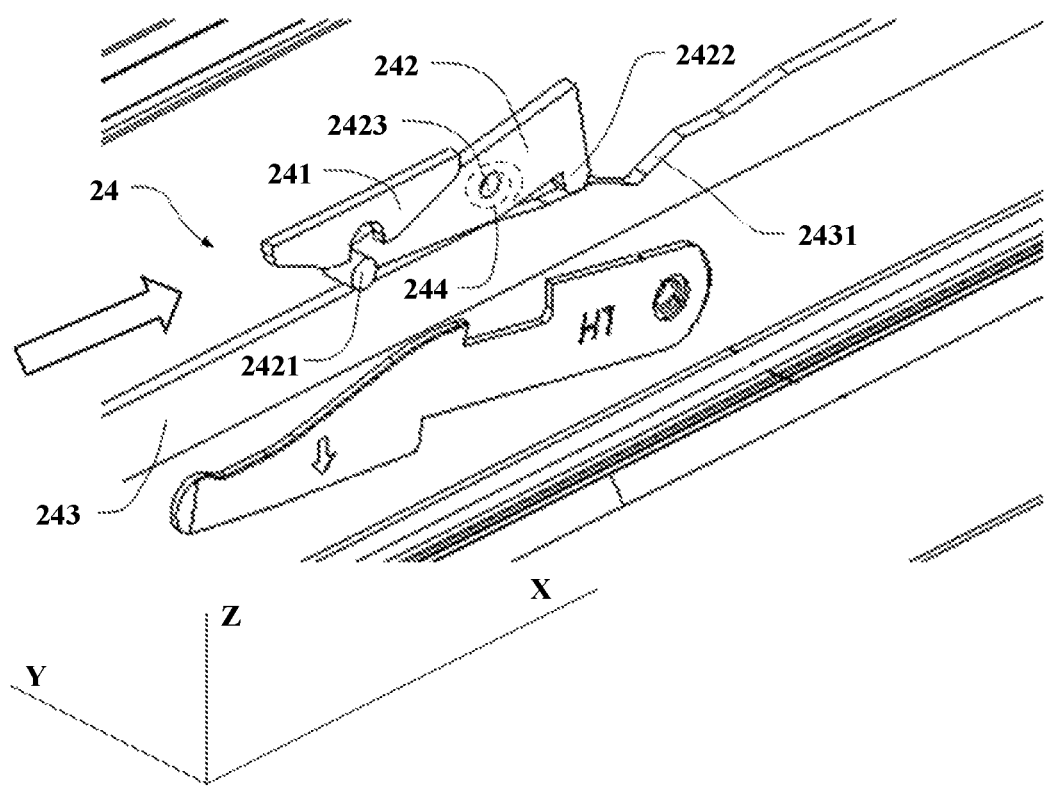
FIG. 11 is a schematic diagram of a status of a first limiting assembly when an installation frame slides out from a second end of a chassis body according to an embodiment of this application.

In a specific embodiment, refer to FIG. 9 to FIG. 11. FIG. 9 is a schematic diagram of a status of a first limiting assembly when an installation frame is fastened to a chassis body according to an embodiment of this application. FIG. 10 is a schematic diagram of a status of a first limiting assembly when an installation frame slides out from a first end of a chassis body according to an embodiment of this application. FIG. 11 is a schematic diagram of a status of a first limiting assembly when an installation frame slides out from a second end of a chassis body according to an embodiment of this application. The first limiting assembly 24 may include a fastening member 241 disposed on the first sliding rail 231 through fastening and a rotating member 242 rotatably disposed on the second sliding rail 232, the rotating member 242 is rotatably connected to the second sliding rail 232 by using a rotating shaft 2423, and the rotating shaft 2423 extends in the second direction Y. The rotating member 242 includes a limiting part 2421 and a drive part 2422, the limiting part 2421 fits with the fastening member 241 through clamping, and the drive part 2422 cooperates with the second drive component to drive the rotating member 242 to rotate. The fastening member 241 serves as the first clamping part, the rotating member 242 may serve as the second clamping part, and the limiting part 2421 of the rotating member 242 fits with the fastening member 241 through clamping. The first limiting assembly 24 may further include a pull lever 243 and a reset member 244. The pull lever 243 is slidably assembled in the second sliding rail 232 as the second drive component. The reset member 244 is disposed in the second sliding rail 232 and is connected to the rotating member 242 as the first drive component, to drive the rotating member 242 to rotate in a direction in which the limiting part 2421 faces the fastening member 241, or apply, to the rotating member 242, a driving force for clamping the limiting part 2421 with the fastening member 241, to enable the limiting part 2421 of the rotating member 242 tends to be clamped with the fastening member 241. There is a stepped inclined surface 2431 on a side that is of the pull lever 243 and that faces the rotating member 242, and a height of the pull lever 243 changes on the stepped inclined surface 2431 in the third direction Z. The drive part 2422 of the rotating member 242 abuts against the stepped inclined surface 2431 under the action of the reset member 244. With pushing and pulling of the pull lever 243, the pull lever 243 slides in the first direction X, and the drive part 2422 slides on the stepped inclined surface 2431, to drive the rotating part to rotate around the rotating shaft 2423, and specifically, drive the rotating member 242 to rotate in a direction in which the limiting part 2421 gets away from the fastening member 241. As shown in FIG. 9, when the installation frame 22 is located in the chassis body 21, does not slide out of the chassis body 21, and is completely located in the chassis body 21, the pull lever 243 is pushed and pulled to enable a specified part of the stepped inclined surface 2431 of the pull lever 243 to abut against the drive part 2422 of the rotating member 242. In this case, the limiting part 2421 is clamped with the fastening member 241 under the action of the reset member 244, so that the installation frame 22 is fastened to the chassis body 21 in the sliding direction of the sliding rail assembly. As shown in FIG. 10 and FIG. 11, when the installation frame 22 needs to be pushed and pulled, the pull lever 243 is first pushed and pulled, to enable the drive part 2422 of the rotating member 242 to slide on the stepped inclined surface 2431 of the pull lever 243, to drive the rotating member 242 to rotate, to detach the limiting part 2421 from the fastening member 241. Therefore, the installation frame 22 can be pushed and pulled, to enable the installation frame 22 to slide out of the chassis body 21.

In another embodiment, alternatively, the fastening member may serve as the second clamping part, and the rotating member serves as the first clamping part, that is, the fastening member is disposed on the second sliding rail, and the rotating member is disposed on the first sliding rail. Correspondingly, the reset member and the pull lever are also disposed on the first sliding rail. A structure of the first limiting assembly in this embodiment is the same as that in the foregoing embodiment, and a difference lies only in an opposite specific setting direction of the first limiting assembly in the first sliding rail and the second sliding rail.

When the fastening member and the rotating member are specifically disposed, the fastening member may be a protrusion, and the limiting part of the rotating member may be a clamping slot; or the fastening member may be a clamping slot, and the limiting part of the rotating member may be a protrusion, provided that the limiting part can be clamped with the clamping slot. The drive part of the rotating member may also be a protruded structure, to facilitate sliding of the drive part along the stepped inclined surface, thereby reducing structural interference cases. There may be a rounded-angle structure on a surface that is of the protruded structure and that abuts against the stepped inclined surface. Specifically, an edge that is of the protruded structure and that extends in the second direction Y is a rounded-angle structure, to facilitate sliding of the drive part on the stepped inclined surface of the pull lever.

When the reset member is specifically disposed, the reset member may be a rotary spring. The rotary spring can provide a reset torsion force for rotating of the rotating member, and occupies relatively small installation space.

Figure 12:
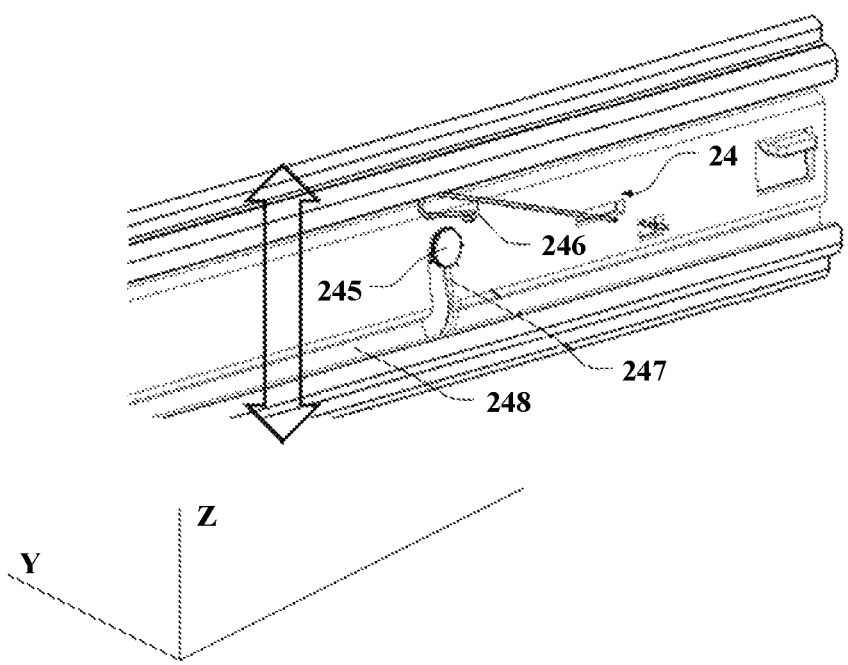
FIG. 12 is a schematic diagram of a structure of a first limiting assembly according to an embodiment of this application.

FIG. 12 is a schematic diagram of a structure of a first limiting assembly according to an embodiment of this application. In another embodiment, the first limiting assembly 24 may include a clamping post 245 disposed on the first sliding rail 231 and a poke lever 246 disposed on the second sliding rail 232, the second sliding rail 232 includes a sliding slot 247 that fits with the clamping post 245 and a sliding track 248 that extends in the first direction X, an extending direction of the sliding slot 247 is approximately parallel to the third direction Z, and the clamping post 245 has a clamping head clamped with the sliding slot 247. The clamping post 245 is connected to a reset component (not shown), the reset component drives the clamping post 245 to move toward the bottom of the sliding slot 247, so that the clamping post 245 can slide into the sliding slot 247 when the sliding slot 247 is opposite to the clamping post 245. When the clamping post 245 is located in the sliding slot 247, the poke lever 246 can lap the clamping post 245, and the poke lever 246 can push the clamping post 245 to move in a direction in which the clamping post 245 is detached from the sliding slot 247. When the installation frame 22 is located in the chassis body 21, does not slide out of the chassis body 21, and is completely located in the chassis body 21, the elastic clamping post 245 is opposite to the sliding slot 247, and can slide into the sliding slot 247 under an elastic effect of the elastic clamping post, to limit the installation frame 22 with the chassis body 21 in the sliding direction of the sliding assembly 23. When the installation frame 22 needs to be pushed and pulled, the poke lever 246 is tripped to enable the elastic clamping post 245 to slide out of the sliding slot 247 and slide along the sliding track 248, to enable the installation frame 22 to slide out of the chassis body 21.

When the poke lever is specifically disposed, the poke lever may be an elastic poke lever or connected to an elastic reset structure. After the poke lever enables the clamping post to slide out of the sliding slot, the poke lever may be reset to an initial position. The initial position is a position at which the poke lever laps the clamping post when the clamping post is located in the sliding slot.

The clamping post and the reset component may be in an integral structure, that is, the clamping post has elasticity, and is, for example, a spring plate. Alternatively, the reset component is an independent structure such as a telescopic spring, and is connected to the clamping post.

To form the sliding track 248 in the second sliding rail 232, a width of the second sliding rail 232 in the third direction Z may be enabled to be less than a width of the first sliding rail 231 in the third direction Z. The sliding slot 247 is a gap of the second sliding rail 232. When the clamping post 245 slides on the sliding track 248, the clamping post 245 abuts against a sidewall of the second sliding rail 232 due to an elastic force of the reset component.

In another embodiment, the clamping post serves as the second clamping part, and the sliding slot serves as the first clamping part, that is, the clamping post and the reset component are disposed on the second sliding rail, and the sliding slot, the poke lever, and the sliding track are disposed on the first sliding rail. A structure of the first limiting assembly in this embodiment is the same as that in the foregoing embodiment, and a difference lies only in an opposite specific setting direction of the first limiting assembly in the first sliding rail and the second sliding rail.

When the first limiting assembly 24 is specifically disposed, a specific position of the first limiting assembly 24 in the sliding rail assembly in the first direction X is not limited. In an embodiment, referring to FIG. 7 and FIG. 8, the first limiting assembly 24 is located in a middle area of the sliding rail assembly in the first direction X, so that structural interference cases between the first limiting assembly 24 and other structures can be reduced. In addition, when the installation frame 22 slides out from the first end 211 or the second end 212 of the chassis body 21, the first limiting assembly 24 can be located between opposite walls of the installation frame 22 and the chassis body 21.

Referring to FIG. 7 and FIG. 8, in an embodiment of this application, the chassis further includes two second limiting assemblies 25. The two second limiting assemblies 25 are respectively configured to perform limiting when the installation frame 22 slides out from the first end 211 and the second end 212 of the chassis body 21. Specifically, when the first part of the installation frame 22 slides out from the first end 211 of the chassis body 21, a first second limiting assembly 25 enables the installation frame 22 to be fastened relative to the chassis body 21; and when the second part of the installation frame 22 slides out from the second end 212 of the chassis body 21, a second limiting assembly enables the installation frame 22 to be fastened relative to the chassis body 21.

In a specific embodiment, the second limiting assembly 25 may include a third clamping part and a fourth clamping part that fit with each other, where the third clamping part can be clamped with the fourth clamping part; and may further include a third drive component that drives the third clamping part to be clamped with the fourth clamping part, and a fourth drive component that drives the third clamping part to be detached from the fourth clamping part. The third clamping part is located on the first sliding rail 231, and the fourth clamping part is located on the second sliding rail 232. When the installation frame 22 slides out of the chassis body 21 by a specified distance, a third drive component of a second limiting assembly 25 located in a sliding direction of the installation frame 22 drives a third clamping part to be clamped with a fourth clamping part, and the installation frame 22 is kept fastened relative to the chassis body 21, to facilitate installation, disassembly, and maintenance of a structure in the installation frame 22; and when the installation frame 22 needs to be retracted into the chassis body 21, a fourth drive component drives the third clamping part to be detached from the four clamping part, so that the installation frame 22 can be retracted into the chassis body 21.

Figure 13:
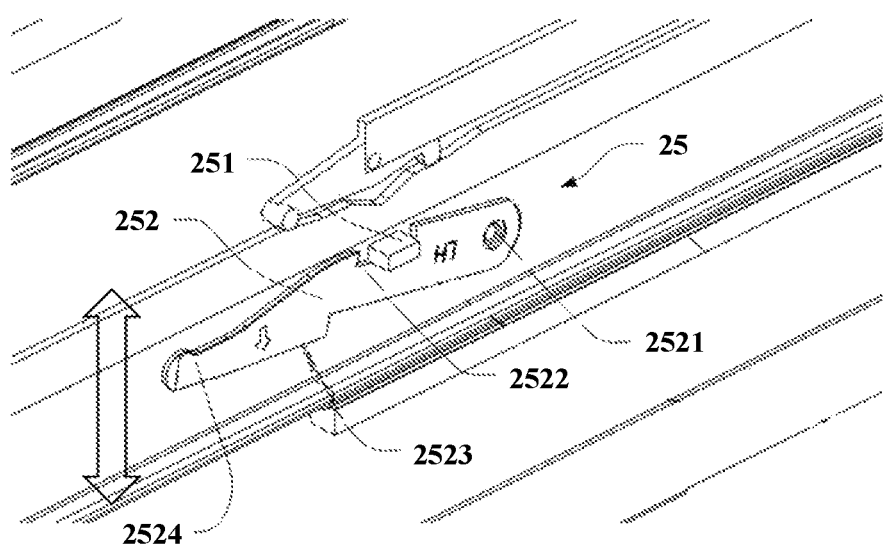
FIG. 13 is a schematic diagram of a structure of a second limiting assembly according to an embodiment of this application.

FIG. 13 is a schematic diagram of a structure of a second limiting assembly according to an embodiment of this application. When the second limiting assembly 25 is specifically disposed, the second limiting assembly 25 includes a limiting protrusion 251 fastened to the first sliding rail 231, and a wrench 252 installed on the second sliding rail 232 by using a rotating shaft 2521, and the rotating shaft 2521 extends in the second direction Y. The wrench 252 has a limiting slot 2522 that fits with the limiting protrusion 251, a reset structure 2523, and an operation part 2524. The reset structure 2523 enables the limiting slot 2522 of the wrench 252 to have an elastic force for rotating in a direction toward the limiting protrusion 251, so that when the limiting protrusion 251 is opposite to the limiting slot 2522, the wrench 252 rotates in a direction in which the limiting slot 2522 approaches the limiting protrusion 251, to clamp the limiting protrusion 251 with the limiting slot 2522. A user trips the operation part 2524, to enable the wrench 252 to have a driving force in a direction in which the limiting slot 2522 gets away from the limiting protrusion 251, so that the wrench 252 rotates in the direction in which the limiting slot 2522 gets away from the limiting protrusion 251, to detach the limiting slot 2522 from the limiting protrusion 251. The limiting protrusion 251 serves as the third clamping part, the limiting slot 2522 serves as the fourth clamping part, the reset structure 2523 serves as the third drive component, and the operation part 2524 serves as the fourth drive component.

In a specific technical solution, the limiting slot 2522 and the operation part 2524 of the wrench 252 may be located on two sides of the rotating shaft 2521, or may be located on a same side of the rotating shaft 2521. In an embodiment, the limiting slot 2522 and the operation part 2524 are located on a same side of the rotating shaft 2521 and are located in a direction in which the rotating shaft 2521 is pulled out toward the installation frame 22. In this solution, when the installation frame 22 is pulled out of the chassis body 21, the operation part 2524 may be protruded from the chassis body 21. Therefore, when the installation frame 22 needs to be slid into the chassis body 21, it is convenient for the user to directly trip the operation part 2524 without cooperation with another structure, to implement a relatively simple structure. The reset structure 2523 may be an elastic spring or a rotary spring, or the wrench 252 has elasticity. This is not specifically limited in this application.

Alternatively, positions of the fastening protrusion and the limiting slot that are clamped with each other are interchangeable, that is, the limiting slot is fastened to the first sliding rail as the third clamping part, and the limiting protrusion is located on the wrench as the fourth clamping part. Specifically, the second limiting assembly includes a limiting slot fastened to the first sliding rail, and a wrench installed on the second sliding rail by using a rotating shaft. The wrench has a limiting protrusion that fits with the limiting slot, a reset structure, and an operation part. The reset structure enables the wrench to have an elastic force for rotating in a direction in which the limiting protrusion faces the limiting slot, so that when the limiting slot is opposite to the limiting protrusion, the wrench rotates in a direction in which the limiting protrusion approaches the limiting slot, to clamp the limiting protrusion with the limiting slot. The user trips the operation part, to enable the limiting protrusion of the wrench to have a driving force in a direction in which the limiting protrusion gets away from the limiting slot, so that the wrench rotates in the direction in which the limiting protrusion gets away from the limiting slot, to detach the limiting slot from the limiting protrusion. The limiting slot serves as the third clamping part, the limiting protrusion serves as the fourth clamping part, the reset structure serves as the third drive component, and the operation part serves as the fourth drive component.

Figure 14:
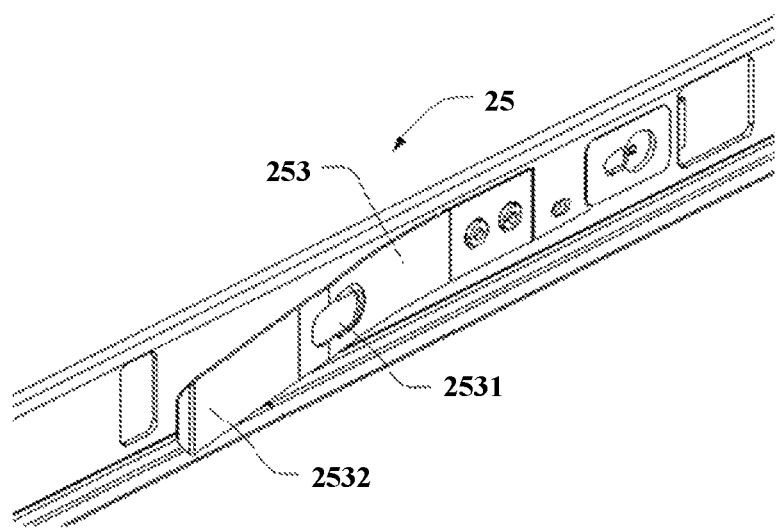
FIG. 14 is a schematic diagram of another structure of a second limiting assembly according to an embodiment of this application.

Refer to FIG. 7, FIG. 8, and FIG. 14. FIG. 14 is a schematic diagram of another structure of a second limiting assembly according to an embodiment of this application. In still another embodiment, the second limiting assembly 25 includes a limiting protrusion (not shown) fastened to the first sliding rail 231, and a spring plate 253 installed on the second sliding rail 232. The spring plate 253 is installed on the second sliding rail 232 in a form of a cantilever. The spring plate 253 has a limiting port 2531 that fits with the limiting protrusion, and a pressing part 2532, and the spring plate 253 has elasticity, so that the spring plate 253 can serve as a reset structure, to enable the spring plate 253 to have an elastic force for swinging in a direction in which the limiting port 2531 faces the limiting protrusion. Therefore, when the limiting protrusion is opposite to the limiting port 2531, the spring plate 253 swings in a direction in which the limiting port 2531 approaches the limiting protrusion, to clamp the limiting protrusion with the limiting port 2531. The user presses the pressing part 2532 of the spring plate 253 to overcome a spring force of the spring plate 253, to enable the spring plate 253 to have a driving force in a direction in which the limiting port 2531 gets away from the limiting protrusion, so that the spring plate 253 swings in the direction in which the limiting port 2531 gets away from the limiting protrusion, to detach the limiting port 2531 from the limiting protrusion. The limiting protrusion serves as the third clamping part, the limiting port 2531 serves as the fourth clamping part, the spring plate 253 serves as the third drive component, and the pressing part 2532 serves as the fourth drive component.

Alternatively, positions of the fastening protrusion and the limiting port that are clamped with each other are interchangeable, that is, the limiting port is fastened to the first sliding rail as the third clamping part, and the limiting protrusion is located on the elastic plate as the fourth clamping part. Specifically, the second limiting assembly includes a limiting port fastened to the first sliding rail and a spring plate installed on the second sliding rail. The spring plate is installed on the second sliding rail in a form of a cantilever. The spring plate has a limiting protrusion that fits with the limiting port, and a pressing part, and the spring plate has elasticity, so that the spring plate can serve as a reset structure, to enable the spring plate to have an elastic force for swinging in a direction in which the limiting protrusion faces the limiting port. Therefore, when the limiting protrusion is opposite to the limiting port, the spring plate swings in a direction in which the limiting protrusion approaches the limiting port, to clamp the limiting port with the limiting protrusion. The user presses the pressing part of the spring plate to overcome a spring force of the spring plate, to enable the spring plate to have a driving force in a direction in which the limiting protrusion gets away from the limiting port, so that the spring swings in the direction in which the limiting protrusion gets away from the limiting port, to detach the limiting port from the limiting protrusion. The limiting port serves as the third clamping part, the limiting protrusion serves as the fourth clamping part, the spring plate serves as the third drive component, and the pressing part serves as the fourth drive component.

Still referring to FIG. 3, in an embodiment provided in this application, the installation frame 22 may specifically include the first accommodation space 221, a fan compartment 223, and the second accommodation space 222. The first accommodation space 221, the fan compartment 223, and the second accommodation space 222 are successively disposed in the direction from the first end 211 of the chassis body 21 to the second end 212 of the chassis body 21. The first accommodation space 221 and the second accommodation space 222 each may accommodate the hard disks, and the fan compartment 223 may accommodate a heat dissipation fan (not shown in the figure). When the installation frame 22 is entirely located in the chassis body 21, airflow generated by the heat dissipation fan may enter the chassis body 21 from the front end of the chassis body 21 (or the first accommodation space 221), and be discharged from the rear end of the chassis body 21 (or the second accommodation space 222). Alternatively, the airflow generated by the heat dissipation fan may enter the rear end of the chassis body 21 (or the second accommodation space 222), and be discharged from the front end of the chassis body 21 (or the first accommodation space 221), to dissipate heat for the components such as the hard disks that are in the first accommodation space 221 and the second accommodation space 222. In this solution, the heat dissipation fan is located between the first accommodation space 221 and the second accommodation space 222. This helps improve a heat dissipation effect of the chassis 2.

In some embodiments, the first part may be the first accommodation space 221, and the second part may be the second accommodation space 222. After the installation frame 22 is pulled out from the front end, the first accommodation space 221 may be exposed outside the chassis body 21, so that a worker can perform work such as maintenance on the components such as the hard disks accommodated in the first accommodation space 221. After the installation frame 22 is pulled out from the rear end of the chassis body 21, the second accommodation space 222 may be exposed outside the chassis body 21, so that the worker can perform work such as maintenance on the components such as the hard disks accommodated in the second accommodation space 222.

In a specific embodiment, not only the first accommodation space 221 or the second accommodation space 222 may slide out of the chassis body 21. For example, the first accommodation space 221 and the fan compartment 223 may slide out of the first end 211 of the chassis body 21 together, and the second accommodation space 222 and the fan compartment 223 may slide out of the second end 212 of the chassis body 21 together. In this case, the first part is the first accommodation space 221 and the fan compartment 223, and the second part is the second accommodation space 222 and the fan compartment 223. Alternatively, a part of the first accommodation space 221 may slide out of the first end 211 of the chassis body 21, and a part of the second accommodation space 222 may slide out of the second end 212 of the chassis body. In this case, the first part is the part of the first accommodation space 221, and the second part is the part of the second accommodation space 222.

In a specific implementation, in the stretching direction of the installation frame 22, a length of the first accommodation space 221 may be the same as or different from a length of the second accommodation space 222. For example, in an embodiment provided in this application, as shown in FIG. 3, in the stretching direction of the installation frame 22, the length of the first accommodation space 221 is the same as or approximately the same as the length of the second accommodation space 222. Specifically, the first accommodation space 221 and the second accommodation space 222 may be symmetrically disposed with respect to the fan compartment 223, so that stretching lengths of the installation frame 22 from the two ends of the chassis body 21 are relatively close, and a stretching length of the installation frame 22 is controlled to be relatively short.

The computing blade in this embodiment of the present invention may alternatively be a processor. This is not limited in this embodiment of the present invention. In addition, the front end and the rear end in the embodiments of the present invention are used as relative concepts, and are not limited to being used as the front end and the rear end in actual product use, but represent the two ends of the channel that passes through the chassis.

What is claimed is:

1. A chassis for mounting storage components, comprising:
   a chassis body having a channel that passes through a first end and a second end of the chassis body;
   an installation frame, slidably disposed in the channel of the chassis body, wherein a first part of the installation frame is configured to slide out from the first end of the chassis body, and a second part of the installation frame is configured to slide out from the second end of the chassis body; and
   a sliding assembly, comprising a first sliding rail, a second sliding rail, and a first limiting assembly, wherein the first sliding rail is fastened to the chassis body, the second sliding rail is fastened to the installation frame, and the first sliding rail and the second sliding rail are slidably assembled; the first limiting assembly comprises a first clamping part and a second clamping part that fit each other, a first drive component that drives the first clamping part to be clamped with the second clamping part, and a second drive component that drives the first clamping part to be detached from the second clamping part; and the first clamping part is disposed on the first sliding rail, and the second clamping part is disposed on the second sliding rail, wherein
   the first drive component drives the first clamping part to be clamped with the second clamping part, to fasten the installation frame to the chassis body in a first direction; the second drive component drives the first clamping part to be detached from the second clamping part, to enable the installation frame to slide out of the chassis body; and the first direction is a sliding direction of the sliding assembly.

2. The chassis according to claim 1, wherein
   the first clamping part is a fastening member fastened to the first sliding rail;
   the second clamping part is a rotating member connected to the second sliding rail by using a rotating shaft, the rotating member comprises a limiting part and a drive part, and the limiting part fits with the fastening member through clamping;

the first drive component is a reset member, and is connected to the rotating member, to drive the rotating member to rotate in a direction in which the limiting part faces the fastening member; and the second drive component is a pull lever and is slidably assembled in the second sliding rail, there is a stepped inclined surface on a side that is of the pull lever and that faces the rotating member, the drive part abuts against the stepped inclined surface, and when the pull lever slides in the first direction, the stepped inclined surface drives the rotating member to rotate in a direction in which the limiting part gets away from the fastening member; or the second clamping part is a fastening member fastened to the second sliding rail;

the first clamping part is a rotating member connected to the first sliding rail by using a rotating shaft, the rotating member comprises a limiting part and a drive part, and the limiting part is capable of fitting with the fastening member through clamping;

the first drive component is a reset member, and is connected to the rotating member, to drive the rotating member to rotate in a direction in which the limiting part faces the fastening member; and the second drive component is a pull lever and is slidably assembled in the first sliding rail, there is a stepped inclined surface on a side that is of the pull lever and that faces the rotating member, the drive part abuts against the stepped inclined surface, and when the pull lever slides in the first direction, the stepped inclined surface drives the rotating member to rotate in a direction in which the limiting part gets away from the fastening member.

3. The chassis according to claim 2, wherein the fastening member is a protrusion, and the limiting part is a clamping slot; or the fastening member is a clamping slot, and the limiting part is a protrusion.

4. The chassis according to claim 1, wherein the first clamping part is a clamping post disposed on the first sliding rail;

the second clamping part is a sliding slot disposed on the second sliding rail, and the clamping post fits with the sliding slot;

the first drive component is a reset component, is connected to the clamping post, to drive the clamping post to move toward the bottom of the sliding slot;

the second drive component is a poke lever and is disposed on the second sliding rail, and when the clamping post is located in the sliding slot, the poke lever is capable of lapping the clamping post, to drive the clamping post to move in a direction in which the clamping post is detached from the sliding slot; and the second sliding rail has a sliding track that extends in the first direction, and the clamping post slides in the sliding track after being detached from the sliding slot; or the second clamping part is a clamping post disposed on the second sliding rail;

the first clamping part is a sliding slot disposed on the first sliding rail, and the clamping post fits with the sliding slot;

the first drive component is a reset component, is connected to the clamping post, to drive the clamping post to move toward the bottom of the sliding slot;

the second drive component is a poke lever and is disposed on the first sliding rail, and when the clamping post is located in the sliding slot, the poke lever is capable of lapping the clamping post, to drive the clamping post to move in a direction in which the clamping post is detached from the sliding slot; and the first sliding rail has a sliding track that extends in the first direction, and the clamping post slides in the sliding track after being detached from the sliding slot.

5. The chassis according to claim 4, wherein the poke lever is an elastic poke lever or the poke lever is connected to an elastic reset structure.

6. The chassis according to claim 1, further comprising two second limiting assemblies, respectively configured to fasten the installation frame to the chassis body after the first part and the second part of the installation frame slide out of the chassis body, wherein the second limiting assembly comprises a third clamping part, a fourth clamping part, a third drive component that drives the third clamping part to be clamped with the fourth clamping part, and a fourth drive component that drives the third clamping part to be detached from the fourth clamping part, wherein the third clamping part is located on the first sliding rail, and the fourth clamping part is located on the second sliding rail; and when one end of the installation frame slides out of the chassis body by a specified distance, a third drive component corresponding to the end drives a third clamping part to be clamped with a fourth clamping part, to fasten the installation frame to the chassis body in the first direction; and a fourth drive component drives the third clamping part to be detached from the fourth clamping part, to enable the installation frame to slide into the chassis body.

7. The chassis according to claim 6, wherein the second limiting assembly comprises the third clamping part fastened to the first sliding rail and a wrench connected to the second sliding rail by using a rotating axis, the wrench comprises the fourth clamping part, a reset structure, and an operation part, and the reset structure drives the wrench to rotate in a direction in which the fourth clamping part faces the third clamping part; the operation part is capable of driving the wrench to rotate in a direction in which the fourth clamping part gets away from the third clamping part; and the reset structure is the third drive component, and the operation part is the fourth drive component.

8. The chassis according to claim 6, wherein the second limiting assembly comprises the third clamping part fastened to the first sliding rail and a spring plate installed on the second sliding rail, the spring plate comprises the fourth clamping part and an operation part, and the spring plate drives the spring plate to swing in a direction in which the fourth clamping part faces the third clamping part; the operation part is capable of driving the spring plate to swing in a direction in which the fourth clamping part gets away from the third clamping part; and the spring plate is the third drive component, and the operation part is the fourth drive component.

9. The chassis according to claim 6, wherein the third clamping part is a limiting protrusion, and the fourth clamping part is a limiting slot; or the third clamping part is a limiting slot, and the fourth clamping part is a limiting protrusion.

10. A storage device, comprising:
a chassis; and
a storage component mounted in the chassis;
wherein the chassis comprises:
a chassis body having a channel that passes through a first end and a second end of the chassis body;

an installation frame, slidably disposed in the channel of the chassis body, wherein a first part of the installation frame is configured for sliding out from the first end of the chassis body, and a second part of the installation frame is capable of sliding out from the second end of the chassis body; and a sliding assembly, comprising a first sliding rail, a second sliding rail, and a first limiting assembly, wherein the first sliding rail is fastened to the chassis body, the second sliding rail is fastened to the installation frame, and the first sliding rail and the second sliding rail are slidably assembled; the first limiting assembly comprises a first clamping part and a second clamping part that fit each other, a first drive component that drives the first clamping part to be clamped with the second clamping part, and a second drive component that drives the first clamping part to be detached from the second clamping part; and the first clamping part is disposed on the first sliding rail, and the second clamping part is disposed on the second sliding rail, wherein the first drive component drives the first clamping part to be clamped with the second clamping part, to fasten the installation frame to the chassis body in a first direction; the second drive component drives the first clamping part to be detached from the second clamping part, to enable the installation frame to slide out of the chassis body; and the first direction is a sliding direction of the sliding assembly.

11. The storage device according to claim 10, wherein the storage component is a hard disk installed in the installation frame of the chassis.

12. The storage device according to claim 10, wherein
the first clamping part is a fastening member fastened to the first sliding rail;
the second clamping part is a rotating member connected to the second sliding rail by using a rotating shaft, the rotating member comprises a limiting part and a drive part, and the limiting part fits with the fastening member through clamping;
the first drive component is a reset member, and is connected to the rotating member, to drive the rotating member to rotate in a direction in which the limiting part faces the fastening member; and
the second drive component is a pull lever and is slidably assembled in the second sliding rail, there is a stepped inclined surface on a side that is of the pull lever and that faces the rotating member, the drive part abuts against the stepped inclined surface, and when the pull lever slides in the first direction, the stepped inclined surface drives the rotating member to rotate in a direction in which the limiting part gets away from the fastening member; or
the second clamping part is a fastening member fastened to the second sliding rail;
the first clamping part is a rotating member connected to the first sliding rail by using a rotating shaft, the rotating member comprises a limiting part and a drive part, and the limiting part is capable of fitting with the fastening member through clamping;
the first drive component is a reset member, and is connected to the rotating member, to drive the rotating member to rotate in a direction in which the limiting part faces the fastening member; and
the second drive component is a pull lever and is slidably assembled in the first sliding rail, there is a stepped inclined surface on a side that is of the pull lever and that faces the rotating member, the drive part abuts against the stepped inclined surface, and when the pull lever slides in the first direction, the stepped inclined surface drives the rotating member to rotate in a direction in which the limiting part gets away from the fastening member.

13. The storage device according to claim 12, wherein the fastening member is a protrusion, and the limiting part is a clamping slot; or the fastening member is a clamping slot, and the limiting part is a protrusion.

14. The storage device according to claim 10, wherein
the first clamping part is a clamping post disposed on the first sliding rail;
the second clamping part is a sliding slot disposed on the second sliding rail, and the clamping post fits with the sliding slot;
the first drive component is a reset component, is connected to the clamping post, to drive the clamping post to move toward the bottom of the sliding slot;
the second drive component is a poke lever and is disposed on the second sliding rail, and when the clamping post is located in the sliding slot, the poke lever is capable of lapping the clamping post, to drive the clamping post to move in a direction in which the clamping post is detached from the sliding slot; and
the second sliding rail has a sliding track that extends in the first direction, and the clamping post slides in the sliding track after being detached from the sliding slot; or
the second clamping part is a clamping post disposed on the second sliding rail;
the first clamping part is a sliding slot disposed on the first sliding rail, and the clamping post fits with the sliding slot;
the first drive component is a reset component, is connected to the clamping post, to drive the clamping post to move toward the bottom of the sliding slot;
the second drive component is a poke lever and is disposed on the first sliding rail, and when the clamping post is located in the sliding slot, the poke lever is capable of lapping the clamping post, to drive the clamping post to move in a direction in which the clamping post is detached from the sliding slot; and
the first sliding rail has a sliding track that extends in the first direction, and the clamping post slides in the sliding track after being detached from the sliding slot.

15. The storage device according to claim 14, wherein the poke lever is an elastic poke lever or the poke lever is connected to an elastic reset structure.

16. The storage device according to claim 10, further comprising two second limiting assemblies, respectively configured to fasten the installation frame to the chassis body after the first part and the second part of the installation frame slide out of the chassis body, wherein
the second limiting assembly comprises a third clamping part, a fourth clamping part, a third drive component that drives the third clamping part to be clamped with the fourth clamping part, and a fourth drive component that drives the third clamping part to be detached from the fourth clamping part, wherein the third clamping part is located on the first sliding rail, and the fourth clamping part is located on the second sliding rail; and
when one end of the installation frame slides out of the chassis body by a specified distance, a third drive component corresponding to the end drives a third clamping part to be clamped with a fourth clamping part, to fasten the installation frame to the chassis body in the first direction; and a fourth drive component drives the third clamping part to be detached from the fourth clamping part, to enable the installation frame to slide into the chassis body.

17. The storage device according to claim 16, wherein the second limiting assembly comprises the third clamping part fastened to the first sliding rail and a wrench connected to the second sliding rail by using a rotating axis, the wrench comprises the fourth clamping part, a reset structure, and an operation part, and the reset structure drives the wrench to rotate in a direction in which the fourth clamping part faces the third clamping part; the operation part is capable of driving the wrench to rotate in a direction in which the fourth clamping part gets away from the third clamping part; and the reset structure is the third drive component, and the operation part is the fourth drive component.

18. The storage device according to claim 16, wherein the second limiting assembly comprises the third clamping part fastened to the first sliding rail and a spring plate installed on the second sliding rail, the spring plate comprises the fourth clamping part and an operation part, and the spring plate drives the spring plate to swing in a direction in which the fourth clamping part faces the third clamping part; the operation part is capable of driving the spring plate to swing in a direction in which the fourth clamping part gets away from the third clamping part; and the spring plate is the third drive component, and the operation part is the fourth drive component.

19. The storage device according to claim 18, wherein the third clamping part is a limiting protrusion, and the fourth clamping part is a limiting slot; or the third clamping part is a limiting slot, and the fourth clamping part is a limiting protrusion.

\* \* \* \* \*